United States Patent [19]
Ino et al.

[11] Patent Number: 5,903,014
[45] Date of Patent: *May 11, 1999

[54] SEMICONDUCTOR DEVICE FOR DRIVING A SUBSTRATE OF AN ELECTRO-OPTICAL DEVICE

[75] Inventors: Masumitsu Ino; Toshikazu Maekawa; Yuki Tashiro; Yasushi Shimogaichi; Shintaro Morita, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/757,279

[22] Filed: Nov. 27, 1996

[30] Foreign Application Priority Data

Nov. 30, 1995 [JP] Japan .............................. P07-335772

[51] Int. Cl.⁶ .................................................. H01L 29/72
[52] U.S. Cl. ................................ 257/66; 257/69; 257/70; 257/72; 257/75; 257/347; 257/353; 257/507
[58] Field of Search .............................. 257/66, 69, 70, 257/72, 75, 347, 353, 507

[56] References Cited

U.S. PATENT DOCUMENTS

| | | | |
|---|---|---|---|
| 5,109,260 | 4/1992 | Tanaka et al. | 257/66 |
| 5,262,655 | 11/1993 | Ashida | 257/347 |
| 5,283,455 | 2/1994 | Inoue et al. | 257/344 |
| 5,382,807 | 1/1995 | Tsutsumi et al. | 257/336 |
| 5,393,992 | 2/1995 | Suzuki | 257/69 |
| 5,430,320 | 7/1995 | Lee | 257/412 |
| 5,567,959 | 10/1996 | Mineji | 257/69 |
| 5,600,154 | 2/1997 | Shimizu et al. | 257/66 |
| 5,614,728 | 3/1997 | Akiyama | 257/57 |

*Primary Examiner*—Edward Wojciechowicz
*Attorney, Agent, or Firm*—Hill & Simpson

[57] ABSTRACT

A semiconductor device includes an insulating substrate; a plurality of pixel electrodes arranged in a matrix on the insulating substrate; first thin film transistors for individually driving the pixel electrodes; and driving circuits composed of second thin film transistors formed on the insulating substrate. In this semiconductor device, each of the first and second thin film transistors has a bottom-gate structure comprising a gate electrode patterned on the insulating substrate; a gate insulating film covering the gate electrode; and a semiconducting thin film having a channel region and a source/drain region, which is formed on the gate insulating film. Each of the second thin film transistors has a lightly doped region at least between a drain side highly doped region and the channel region. The lightly doped region mitigates an electric field concentration at a drain edge and hence suppresses harmful charges generated both in an interlayer insulating film and in the gate insulating film which are respectively brought in contact with upper and lower sides of the semiconducting thin film.

12 Claims, 12 Drawing Sheets

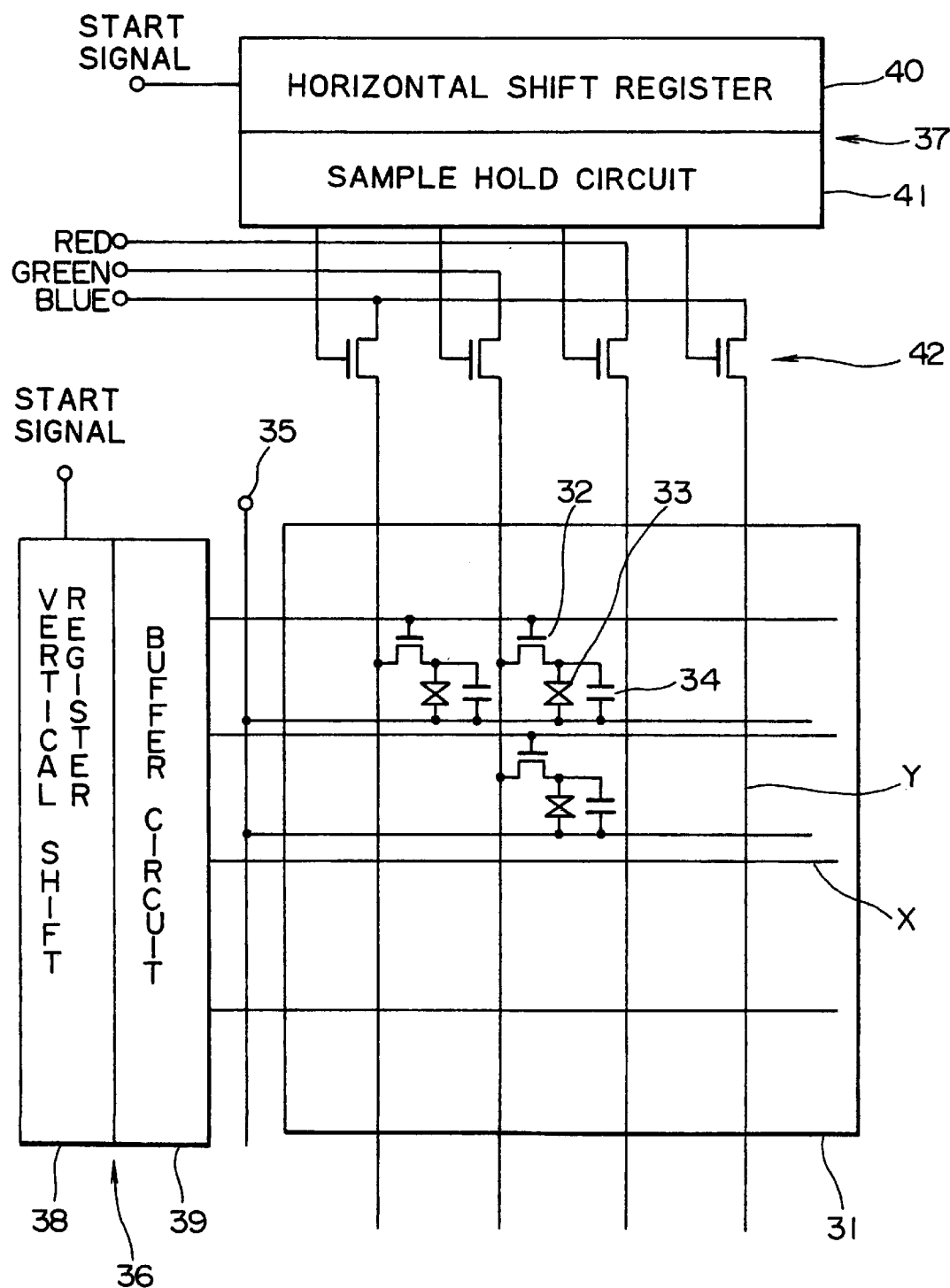

5,903,014

SEMICONDUCTOR DEVICE FOR DRIVING A SUBSTRATE OF AN ELECTRO-OPTICAL DEVICE

BACKGROUND OF THE INVENTION

The present invention relates to a semiconductor device including an insulating substrate, a plurality of pixel electrodes arranged in a matrix on the insulating substrate, switching elements for individually driving the pixel electrodes, and driving circuits formed on the insulating substrate for operating the switching elements, and particularly to a structure of a bottom-gate type thin film transistor constituting each of the switching elements and the driving circuits.

Semiconductor devices each having integrated thin film transistors and the like are particularly suitable for driving substrates of active matrix type electro-optical devices, and therefore, they are being extensively developed at present. A thin film transistor has a semiconducting thin film as an active layer, which is made from amorphous silicon or polycrystalline silicon. The polycrystalline silicon transistor is superior in electric characteristics such as a carrier mobility to the amorphous silicon transistor, and it can be used for a peripheral driving circuit as well as for a switching element. In this regard, studies are being actively conducted on the polycrystalline transistors. On the other hand, when used for an active matrix display which is one example of the active matrix type electro-optical devices, the semiconductor device must adopt an inexpensive large-sized insulating substrate. From this viewpoint, there is a strong demand to develop a low temperature process capable of forming thin film transistors at a temperature in a range of 600° C. or less, preferably, 400° C. or less. Laser annealing or ion doping becomes important for the low temperature process. Moreover, from the standpoint of the structure, the thin film transistor is classified into a bottom-gate type (reversely staggered type) and a top-gate type. The bottom-gate type is superior to the top-gate type in terms of compatibility with the low temperature process, which has been proposed, for example, in Japanese Patent Laid-open Nos. Hei 4-186735 and Hei 6-350089.

In summary, the bottom-gate type polycrystalline silicon thin film transistor is regarded hopeful in that it can be formed by the low temperature process and it can constitute a peripheral driving circuit. One example of the thin film transistors of this type will be described with reference to FIG. 8. As shown in this figure, a bottom-gate type thin film transistor 100 includes a gate electrode 102 made from a metal film patterned on an insulating substrate 101 made from glass or the like, an gate insulating film 103 covering the gate electrode 102, and a semiconducting thin film 104 formed on the gate insulating film 103. The semiconducting thin film 104 is made from, for example, polycrystalline silicon. A channel region 105 and a highly doped region 106 for forming a drain D and a source S are formed in the semiconducting thin film 104. A first interlayer insulating film 107 serving as a stopper is formed on the channel region 105, and a second interlayer insulating film 108 is formed thereon. The first interlayer insulating film 107 and the second interlayer insulating film 108 may be replaced with a single layer structure. In each case, such an interlayer insulating film, disposed opposite to the gate insulating film 103, is called "back gate insulating film". The second interlayer insulating film 108 has contact holes, through which interconnection electrodes 109 are connected to the source S and the drain D of the thin film transistor 100.

In the structure of the bottom-gate type thin film transistor 100 shown in FIG. 8, the gate electrode 102 is formed on the insulating substrate 101 side and the gate insulating film 103 and the semiconducting thin film 104 are formed on the gate electrode 102, and the interconnection electrodes 109 are formed in such a manner as to be connected to the semiconducting thin film 104. In the case where a semiconductor device having the integrated thin film transistors 100 is applied to a large-sized active matrix display, it is important uses an insulating substrate made from inexpensive glass, and accordingly, it must be fabricated in accordance with a low temperature process performed at a temperature of 400° C. or less. In this case, however, there arises a problem that the film density is coarsened with respect to the interlayer insulating films 107, 108, the gate insulting film 103, and the semiconducting thin film 104 because each film is formed at a low temperature. As a result, the local level density of each film is increased, and thereby charges flowing in the channel region 105 of the thin film transistor 100 in a driving state are injected in an interface between the semiconducting thin film 104 and the insulating film or in the insulating film. In other words, hot carriers are injected into the back gate insulating film and the gate insulating film formed from the interlayer insulating film by impact ionization occurring at the drain edge in a high electric field condition. It is possible that the stationary charges thus injected shift a threshold voltage of the thin film transistor 100, to cause an operation of the transistor even not in the on-state, leading to a malfunction of the peripheral driving circuit.

The problem to be solved will be further described in brief with reference to FIG. 9. The gate insulating film 103, and the interlayer insulating films 107 and 108 located near the back gate contain impurities and migratory ions. This is due to formation of the source S and the drain D by ion doping which is adopted for achieving the low temperature process. Specifically, the ion doping is performed such that an ionized source gas is injected in the semiconducting thin film 104 acceleratedly in the presence of an electric field without mass-separation. As a result, the ion shower contains other impurities than the kinds of targets, and thereby migratory ions and the like are injected in the interlayer insulating films 107 and 108. In the case where a high electric field is applied between the source S and the drain D in such a state, the migratory ions migrate from the drain edge to the source edge. With an N-channel type thin film transistor, the polarity of a portion near the drain edge is changed from $N^+$ into $P^+$ by migration of the migratory ions, to cause current limiting, thereby making it difficult to obtain a sufficient driving current. In particular, when used for a peripheral driving circuit, the thin film transistor having the above configuration arises a problem in degradation of high speed operation. As described above, in the case of the bottom-gate type thin film transistor prepared by the low temperature process, each of the gate insulating film and the interlayer insulating film respectively formed on upper and lower sides of the semiconducting thin film made from polycrystalline silicon or the like must be constituted of a deposition film formed by CVD or the like, tending to be increased in interfacial level density and impurity concentration. Consequently, charges are easily injected in the insulating film by impact ionization under a high electric field applied between the drain and source, and migratory ions acting as undesirable impurities in the insulating film degrade transistor characteristics.

SUMMARY OF THE INVENTION

An object of the present invention is to provide a semiconductor device used for an electro-optical device, which is capable of preventing degradation of characteristics of a thin film transistor of the semiconductor device.

To achieve the above object, according to a first aspect of the present invention, there is provided semiconductor device including:

an insulating substrate;

a plurality of pixel electrodes arranged in a matrix on the insulating substrate;

first thin film transistors for individually driving the pixel electrodes; and driving circuits composed of second thin film transistors formed on the insulating substrate;

wherein each of the first and second thin film transistors has a bottom-gate structure including a gate electrode patterned on the insulating substrate; a gate insulating film covering the gate electrode; and a semiconducting thin film having source/drain regions to form a channel region therebetween, which is formed on the gate insulating film; and each of the second thin film transistors has a lightly doped region at least between a drain side highly doped region and the channel region.

The second thin film transistor preferably has a lightly doped region between a source side highly doped region and the channel region.

The first thin film transistor preferably has a lightly doped region between the drain region and the channel region, and more preferably, it also has a lightly doped region between the source region and the channel region.

The semiconducting thin film may be made from polycrystalline silicon recrystallized by irradiation of a laser beam.

Preferably, the lightly doped region formed between the drain side highly doped region and the channel region mitigates an electric field concentration at a drain edge and hence suppresses charges generated both in an interlayer insulating film and in the gate insulating film which are respectively brought in contact with upper and lower sides of the semiconducting thin film.

To achieve the above object, according to a second aspect of the present invention, there is provided an electro-optical device including:

a transistor array substrate including a first insulating substrate; a plurality of pixel electrodes arranged in a matrix on the first insulating substrate; first thin film transistors for individually driving the pixel electrodes; and driving circuits composed of second thin film transistors formed on the first insulating substrate; wherein each of the first and second thin film transistors has a bottom-gate structure including a gate electrode patterned on the first insulating substrate; a gate insulating film covering the gate electrode; and a semiconducting thin film having source/drain regions to form a channel region therebetween, which is formed on the gate insulating film; and each of the second thin film transistors has a lightly doped region at least between a drain side highly doped region and the channel region;

a counter substrate having a counter electrode, which is joined to the transistor array substrate with a specified gap held therebetween; and an electro-optical material held in the gap.

The second thin film transistor preferably has a lightly doped region between a source side highly doped region and the channel region.

The first thin film transistor preferably has a lightly doped region between the drain region and the channel region, and more preferably, it also has a lightly doped region between the source region and the channel region.

The semiconducting thin film may be made from polycrystalline silicon recrystallized by irradiation of a laser beam.

Preferably, the lightly doped region formed between the drain side highly doped region and the channel region mitigates an electric field concentration at a drain edge and hence suppresses charges generated both in an interlayer insulating film and in the gate insulating film which are respectively brought in contact with upper and lower sides of the semiconducting thin film.

According to the present invention, there is provided the bottom-gate type thin film transistor using polycrystalline silicon recrystallized by laser annealing to prevent a high electric field from applying at a drain edge or the like, wherein a lightly doped diffusion layer (lightly doped region) is formed between a highly doped region for forming a drain region and the like and a channel region. Such a thin film transistor is incorporated in a peripheral driving circuit of a semiconductor for an active matrix display. The provision of such a lightly doped region is effective to relieve an electric field concentration at the drain edge and the like. This makes it possible to reduce the probability of generation of impact ionization, and also to suppress migration of stationary charges in a gate insulating film and a back gate insulating film due to migratory ions near the drain. As a result, it is possible to eliminate the shift of a threshold voltage of the thin film transistor and suppress current limiting at the drain edge, and hence to obtain stable transistor characteristics. In particular, since the driving ability can be enhanced by suppression of current limiting, the semiconductor device using such a thin film transistor can be suitably used for a peripheral driving circuit requiring high speed operation.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 5 is a block diagram showing an active matrix type electro-optical device of the present invention;

DETAILED DESCRIPTION OF THE PREFERRED EMBODIMENTS

Figure 1:
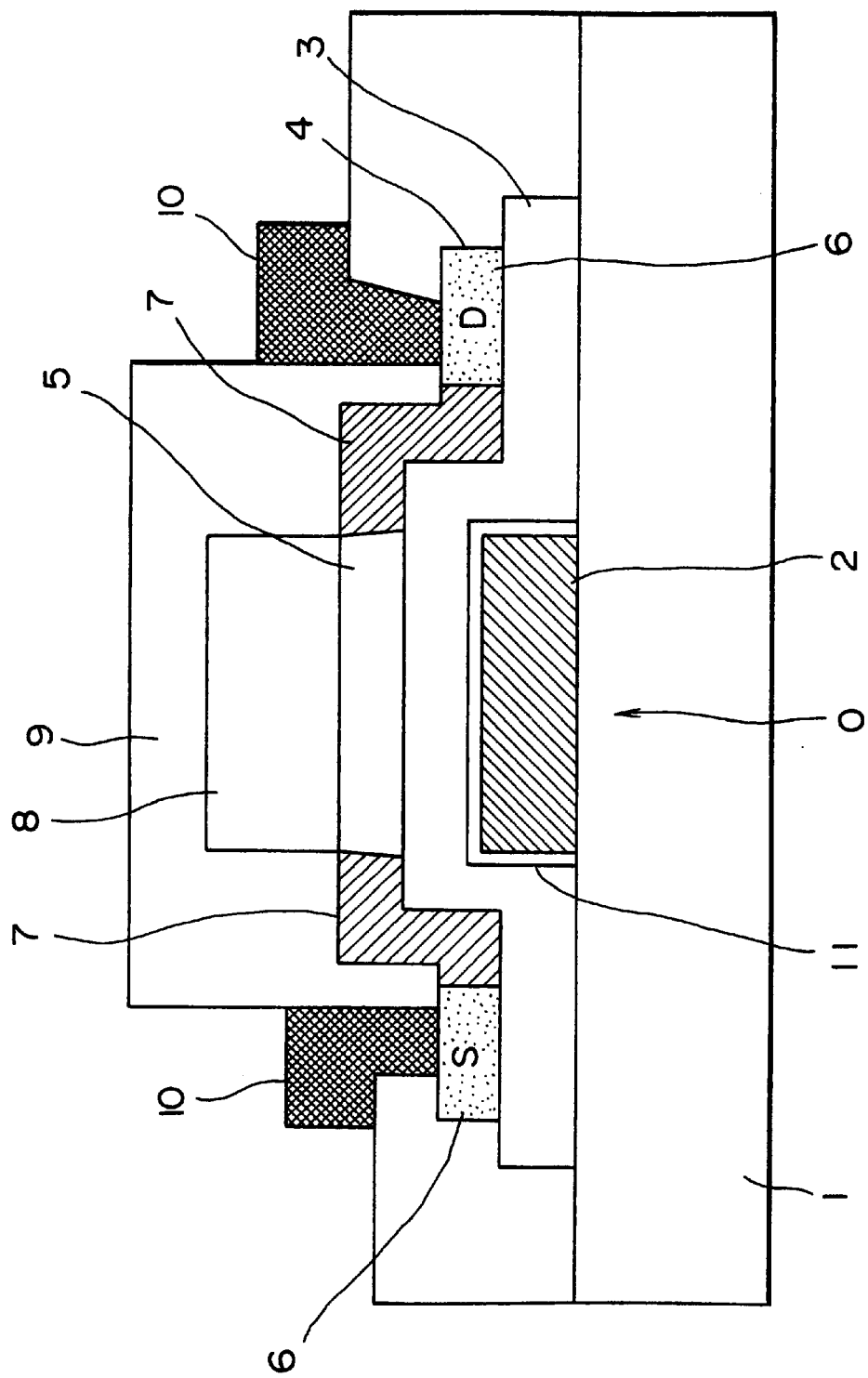
FIG. 1 is a typical sectional view showing a semiconductor device of the present invention.

Hereinafter, preferred embodiments of the present invention will be described in detail with reference to the drawings. FIG. 1 is a typical sectional view showing a basic configuration of a semiconductor device of the present invention. A semiconductor device for an active matrix display basically includes a plurality of pixel electrodes arranged in a matrix on an insulating substrate, switching elements for individually driving the pixel electrodes, and driving circuits formed on the insulating substrate for operating the switching elements. Each of the switching element and the driving circuit is composed of a thin film transistor. For an easy understanding, only one thin film transistor constituting a driving circuit is shown in FIG. 1. Referring to FIG. 1, a thin film transistor 0 includes a gate electrode 2 patterned on an insulating substrate 1, a gate insulating film 3 covering the gate electrode 2, and a semiconducting thin film 4 formed on the gate insulating film 3. The semiconducting thin film 4 is made from, for example, polycrystalline silicon recrystallized by irradiation of a laser beam. A channel region 5 and a highly doped region 6 for forming a drain D and a source S are formed in the semiconducting thin film 4. In this example shown in FIG. 1, the thin film transistor 0 is of an n-channel type, and the highly doped region 6 is of an $N^+$-type. The channel region 5 is covered with a first interlayer insulating film 8 serving as a mask used for ion doping. The thin film transistor 0 is entirely covered with a second interlayer insulating film 9. Interconnection electrodes 10 are patterned on the second interlayer insulating film 9, and are electrically connected to the drain D and the source S through contact holes respectively. In addition, the surface of the gate electrode 2 is covered with an anodic oxide film 11 so as to be planarized.

Here, as a feature of the present invention, the thin film transistor 0 at least constituting a driving circuit has a lightly doped region 7 provided between the highly doped region 6 at least on the drain D side and the channel 5. In this example, the lightly doped region 7 is provided on the source S side as well as on the drain D side. The lightly doped region 7 mitigates electric field concentration at a drain edge and hence suppresses charges generated both in the first and second interlayer insulating films 8 and 9 and in the gate insulating film 3 which are respectively brought in contact with upper and lower sides of the semiconducting thin films 4. Concretely, the mitigation of the electric field concentration at the drain edge can reduce the probability of generation of impact ionization, and also prevents migration of stationary charges in the gate insulating film and the back gate insulating film due to migratory ions near the drain. This makes it possible to eliminate the shift of a threshold voltage of the thin film transistor 0 and suppress current limiting of the transistor at the drain edge, and hence to obtain stable transistor characteristics.

Figure 2:
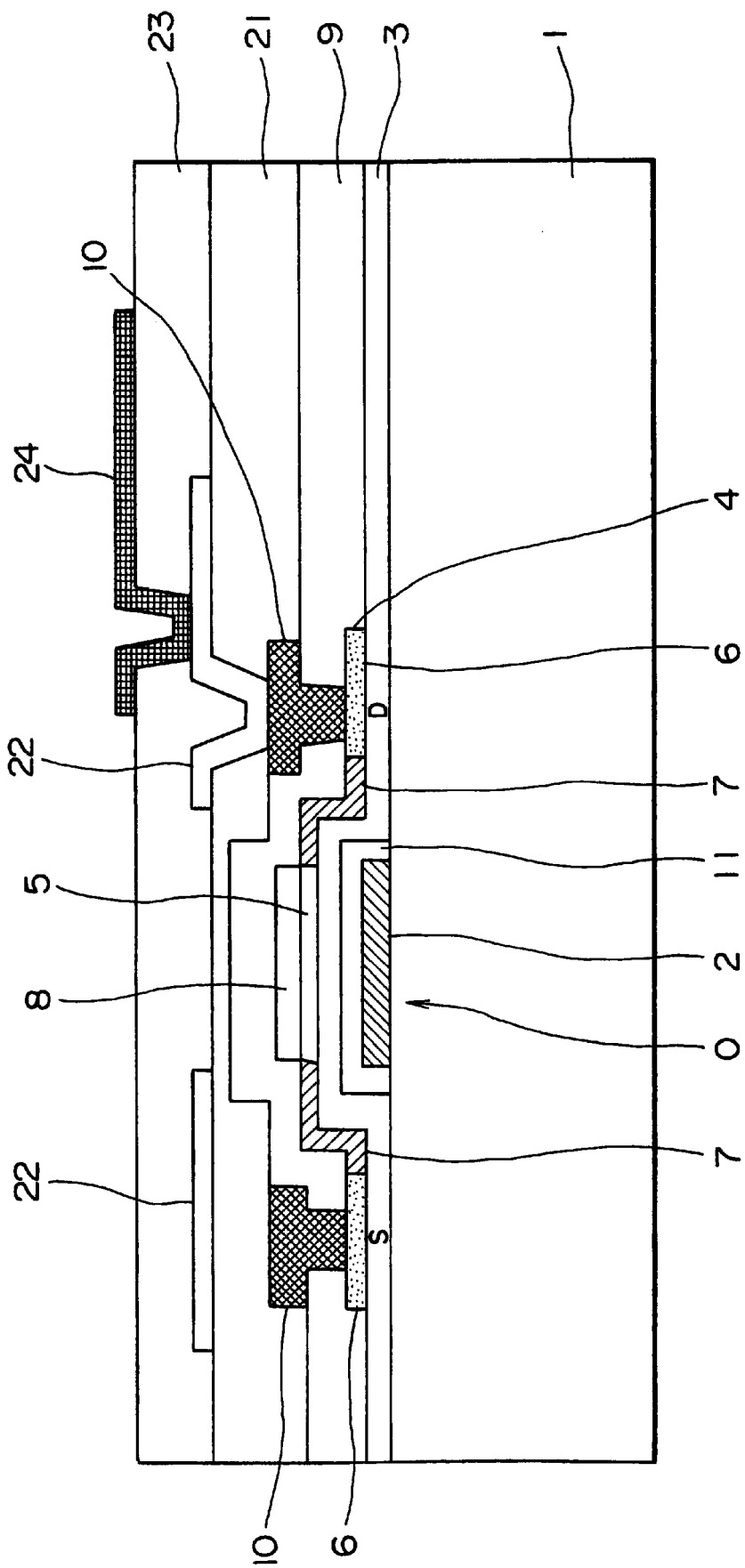
FIG. 2 is a typical sectional view of another portion of the semiconductor device of the present invention.

FIG. 2 is a typical partial sectional view showing another portion of the semiconductor device of the present invention. In this figure, only one thin film transistor 0 constituting a switching element is shown. Like the thin film transistor for the driving circuit shown in FIG. 1, a thin film transistor shown in FIG. 2 is provided with a lightly doped region 7 for mitigating an electric field concentration. This bottom-gate type thin film transistor 0 is covered with a third interlayer insulating film 21. A light-shielding film 22 is patterned on the third interlayer insulating film 21, and a planarization film 23 is formed on the light-shielding film 22. Finally, an pixel electrode 24 is patterned on the planarization film 23, which is electrically connected to a drain D of the thin film transistor 0 through the conductive light-shielding film 22 and an interconnection electrode 10.

Figure 3A:
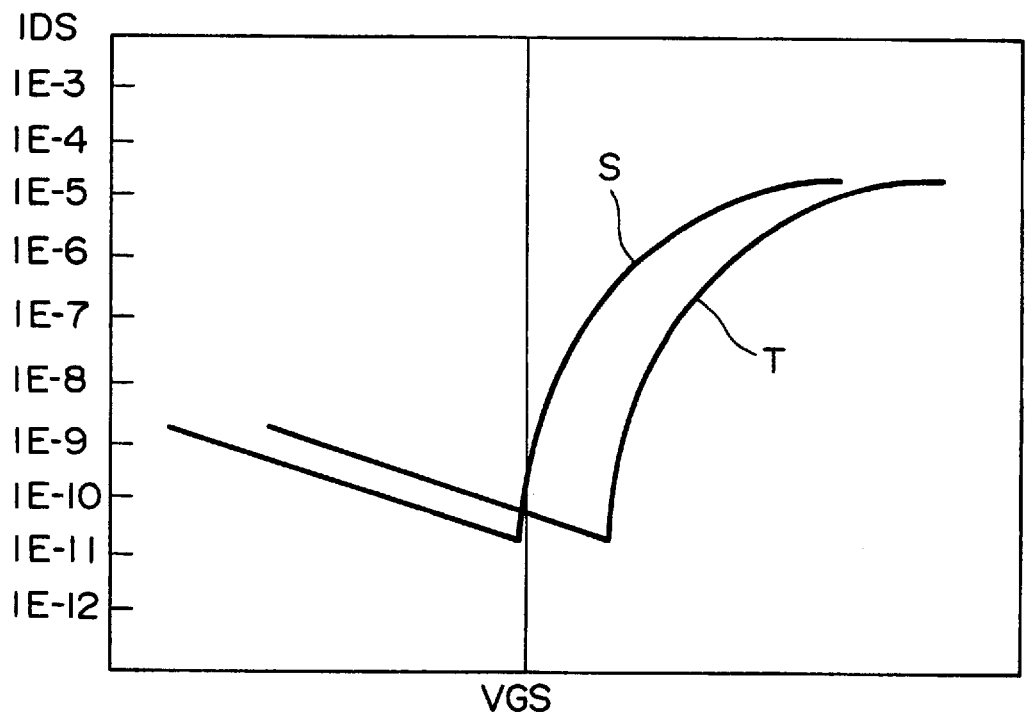
FIGS. 3A and 3B are graphs showing results of reliability tests for a related art thin film transistor and an inventive thin film transistor, respectively.
Figure 3B:
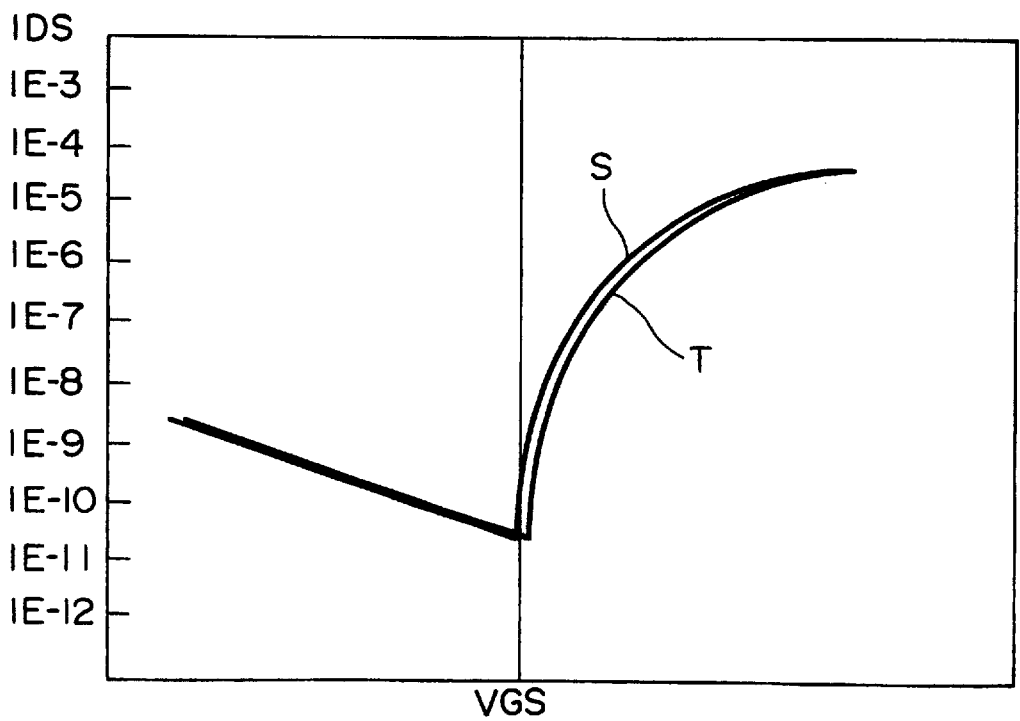

FIG. 3A is a graph showing a result of a reliability test for a related art bottom-gate type thin film transistor not provided with any lightly doped region for mitigating an electric field concentration. In this reliability test, the thin film transistor is applied with a bias while being kept at a high temperature for a specified period of time. A gate voltage VGS-drain current IDS characteristic of the thin film transistor was measured before and after the test. A curve S shows the characteristic before the test while a curve T shows the characteristic after the test. As can be seen from the graph, in the accelerated test in which the thin film transistor is applied with a bias at a high temperature, a threshold voltage is shifted while the on-current is decreased and the off-current is increased. In this way, in the accelerated test, the related art thin film transistor is significantly degraded in characteristics, resulting in the poor reliability. Besides, FIG. 3B shows a result of a reliability test for the inventive thin film transistor having a lightly doped region for mitigating an electric field concentration. As can be seen from this graph, a curve T showing the characteristic after the test is little different from a curve S showing the characteristic before the test. Namely, the threshold voltage and driving current and the like are not changed between before and after the accelerated test.

Figure 4A:
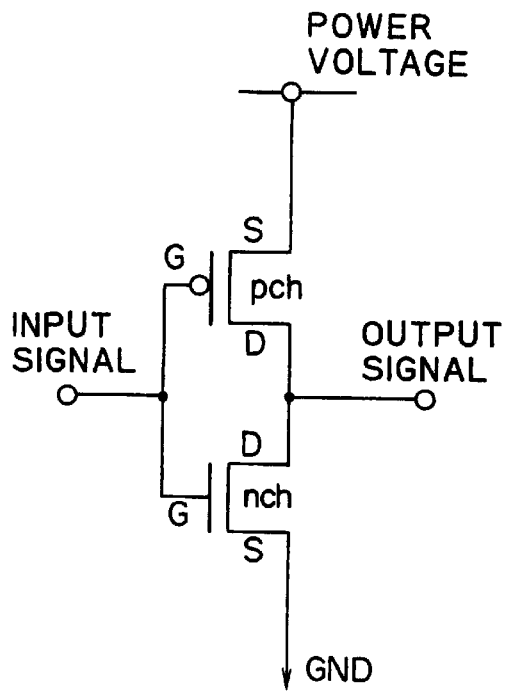
FIGS. 4A to 4D are block diagrams showing inventive CMOS circuits in comparison with a standard CMOS.
Figure 4B:
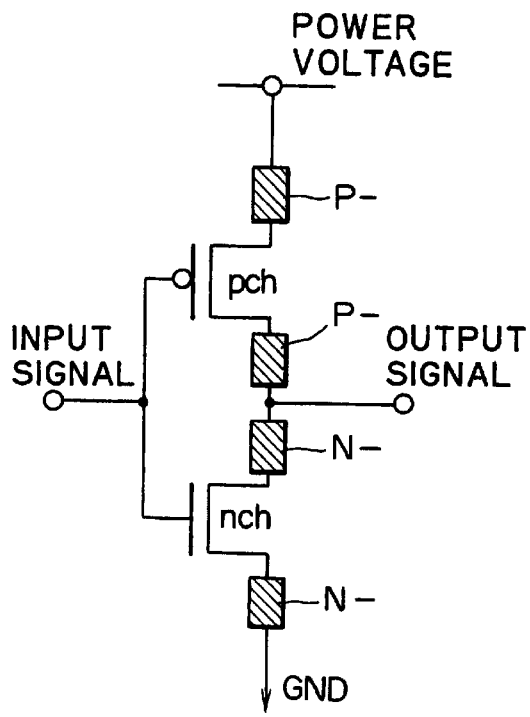
Figure 4C:
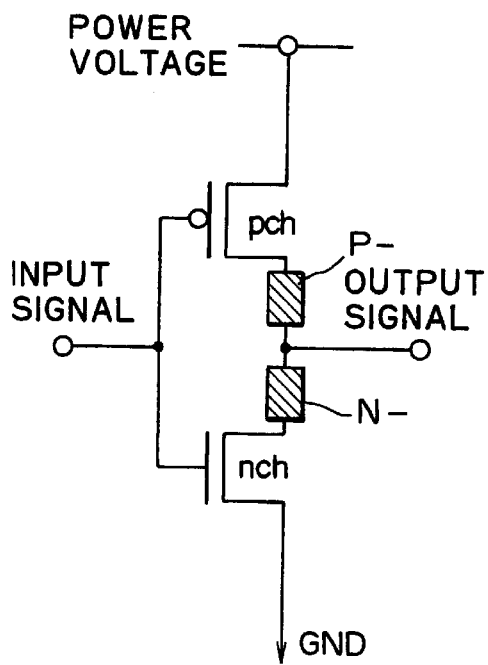
Figure 4D:
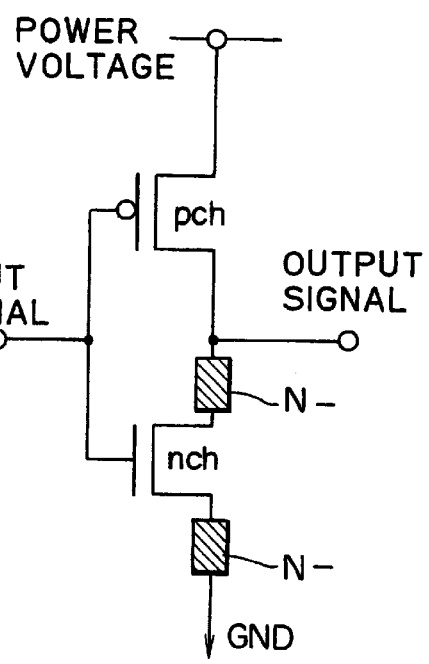

The thin film transistor of the present invention is particularly suitable for a peripheral drive circuit of a semiconductor device for an active matrix display. The peripheral driving circuit is basically composed of a CMOS circuit. FIGS. 4A to 4D show invertors, as examples of the CMOS circuits. FIG. 4A shows a basic configuration of the invertor, in which a p-channel type thin film transistor (pch) is connected in series to an n-channel type thin film transistor (nch). A source S of the pch is connected to a power voltage side, and a source S of the nch is connected to a ground (GND) side. Drains D and D of the pch and nch are commonly connected to form a terminal for an output signal, while gate electrodes G and G of the pch and nch are commonly connected to form a terminal for an input signal. The invertor shown in FIG. 4A is of a standard type not provided with any lightly doped region for mitigating an electric field concentration. On the contrary, in the invertor shown in FIG. 4B as one embodiment of the present invention, lightly doped regions ($P^-$) are provided on the source and drain sides of the pch while lightly doped regions ($N^-$) are provided on the source and drain sides of the nch. In the invertor shown in FIG. 4C, lightly doped regions are provided only on the drain side of the pch and on the drain side of the nch. A high electric concentration is basically generated on the drain side, and accordingly, the lightly doped region may be provided at least in accordance with the configuration shown in FIG. 4C. Additionally, in the invertor shown in FIG. 4D, lightly doped regions are provided only on the source and drain sides of the nch. In general, the degradation of characteristics due to impact ionization tends to be significantly generated on the nch side. For this reason, in the invertor shown in FIG. 4D, the lightly doped regions for mitigating an electric field concentration are provided only on the nch side.

FIG. 5 is a typical block diagram showing a liquid crystal display as one example of an active matrix type electro-optical device incorporated with a semiconductor device of the present invention. As shown in FIG. 5, the electro-optical device includes a screen section 31 and a peripheral circuit section. The screen section 31 has gate lines X and signal lines Y arranged in a matrix. A thin film transistor 32, a liquid crystal capacitive element 33, an additional capacitive element 34 are integrated at each of cross-points between the lines X, Y. The liquid crystal capacitive element 33 is composed of a liquid crystal held between the pixel electrode and the counter electrode 35. The thin film transistor 32 constituting a switching element for driving the pixel electrode has a gate electrode connected to the corresponding ate line X; a source electrode connected to the corresponding signal line Y; and a drain electrode connected to the corresponding pixel electrode. On the other hand, the peripheral circuit section is divided into a vertical driving circuit 36 and a horizontal driving circuit 37. The vertical driving circuit 36 is composed of a vertical shift register 38 and a buffer circuit 39. The buffer circuit 39 is connected to each gate signal X. The vertical shift register 38 outputs a gate pulse to each gate line X in linear sequence through the buffer circuit 39 in response to a start signal inputted from an external circuit. Consequently, each thin film transistor 32 constituting a switching element is selected in linear sequence per line. On the other hand, the horizontal driving circuit 37 is composed of a horizontal shift register 40 and a sample hold circuit 41. The sample hold circuit 41 is connected to each signal line Y by way of a horizontal switch 42. An input terminal of each horizontal switch 42 receives image signals (RED, GREEN and BLUE) of three primary colors. The horizontal shift register 40 sequentially drives the sample hold circuit 41 on the basis of the start signal, to control the opening/closing of the horizontal switch 42 in point sequence. As a result, the image signal is written in each liquid crystal capacitive element 33 in point sequence. In such a configuration, each of the horizontal shift register 40, sample hold circuit 41, vertical shift register 38, and buffer circuit 30 is composed of the bottom-gate type polycrystalline silicon thin film transistor of the present invention. For example, an invertor contained in each circuit adopts the structure shown in each of FIG. 4B, 4C and 4D. In general, the peripheral drive circuit of the active matrix liquid crystal display shown in FIG. 5 operates at a power voltage of 15 V. An electric field applied to the thin film transistor becomes higher at the drain edge. The thin film transistor used for the driving circuit operating at a voltage of 15 V is degraded in current driving ability with time unless it takes a countermeasure for mitigating an electric field concentration. This deteriorates the follow-up performance at a high frequency, and finally makes it impossible to display an image on the screen.

Figure 6:
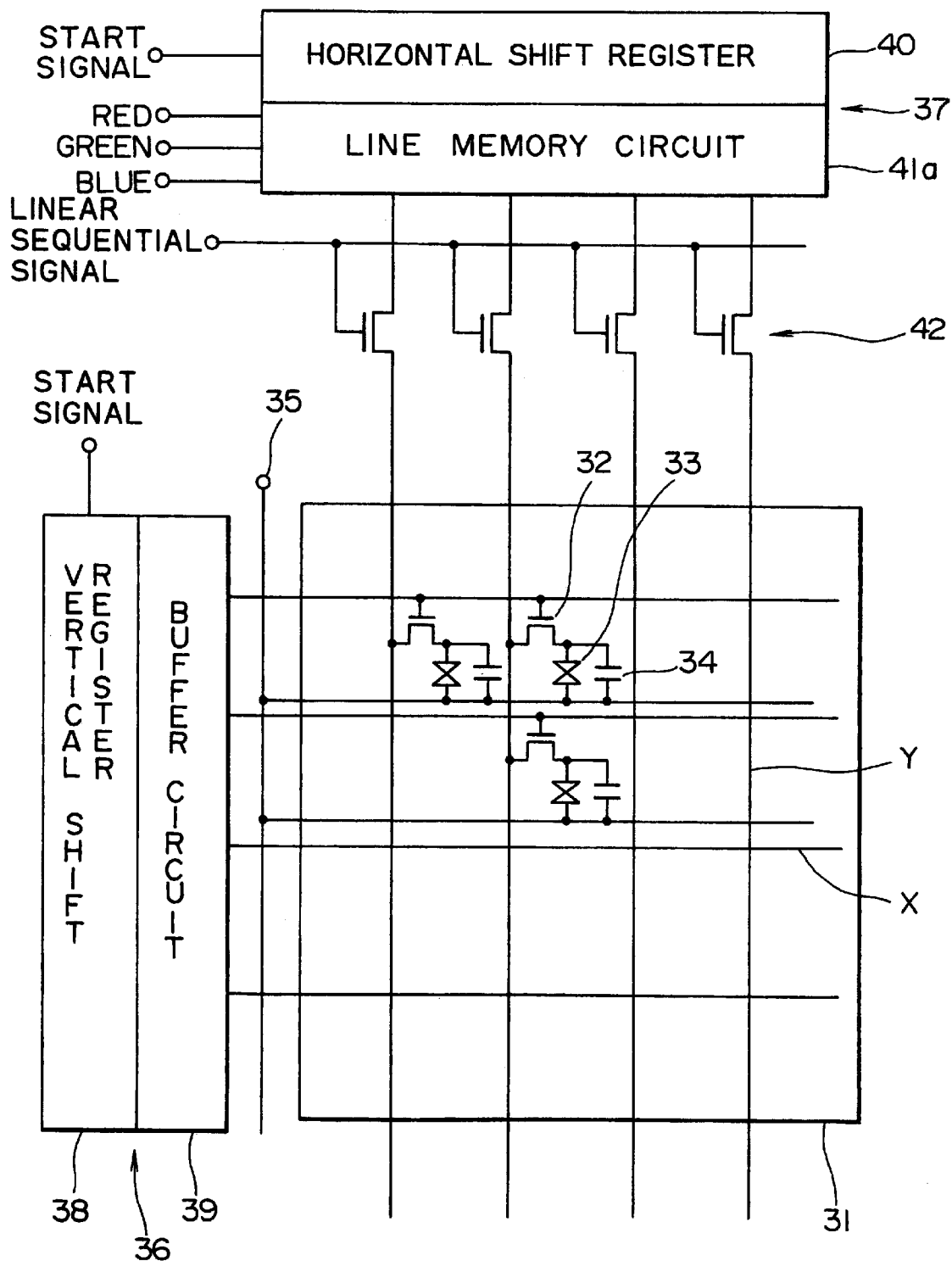
FIG. 6 is a block diagram showing another active matrix type electro-optical device of the present invention.

FIG. 6 is a block diagram showing another electro-optical device of the present invention, which has a basic configuration similar to that shown in FIG. 5. In this figure, for an easy understanding, parts corresponding to those in FIG. 5 are indicated by the same characters. A difference between the electro-optical devices shown in FIGS. 5 and 6 lies in that the device shown in FIG. 5 adopts the point-sequence display system and the device shown in FIG. 6 adopts a linear sequence display system. In accordance with the difference in display system, the sample hold circuit 41 shown in FIG. 5 is replaced with a line memory circuit 41a in FIG. 6. In this case, the horizontal switch 42 receives linear sequence signals from an external circuit, and outputs image signals written in the line memory circuit 41a for each line are outputted on the signal line Y side all together. Since the horizontal shift register 40 and the vertical shift register 38 operate at high speeds even in the linear sequence display system, they must take a countermeasure for mitigating an electric field concentration at the drain edge of the thin film transistor.

Figure 7A:
FIG. 7A to 7Q are process diagrams showing steps of fabricating the semiconductor device of the present invention.
Figure 7B:
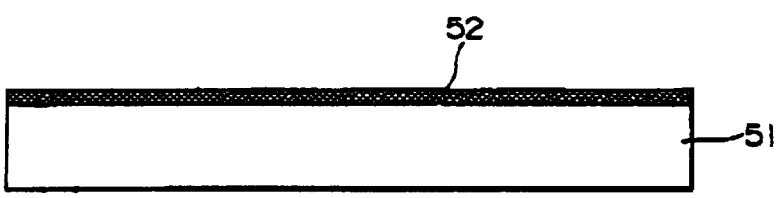
Figure 7C:
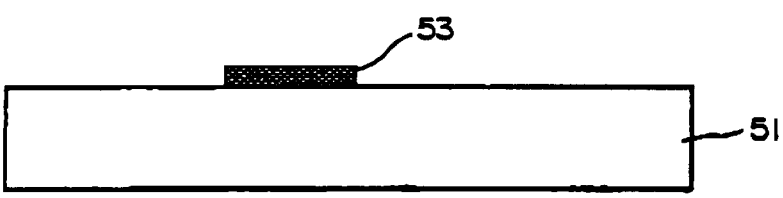
Figure 7D:
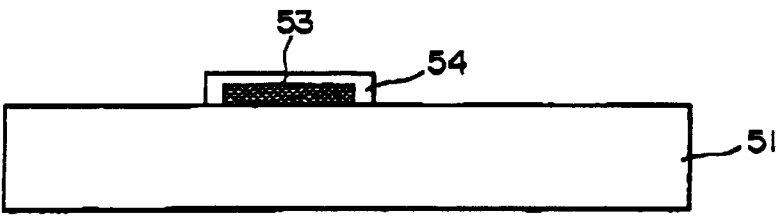
Figure 7E:
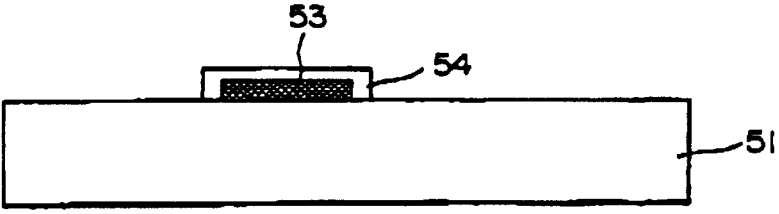

Hereinafter, a method of fabricating the semiconductor device of the present invention will be described in detail with reference to process diagrams shown in FIGS. 7A to 7Q. In a step of FIG. 7A, an insulating substrate 51 made from a low melting point glass or the like is prepared. In a step of FIG. 7B, a metal film 52 made from Mo/Ta or the like is formed on the insulating substrate 51 by sputtering. In a step of FIG. 7C, the metal film 52 is patterned by dry etching to form a gate electrode 53. In a step of FIG. 7D, the gate electrode 53 is covered by an anodic oxide film 54 by anodic oxidation. After that, an electrode portion used for the anodic oxidation is removed by etching. In a step of FIG. 7E, the anodic oxide film 54 is partially removed from the surface of the gate electrode 53 by etching as needed, to provide a contact portion.

Figure 7F:
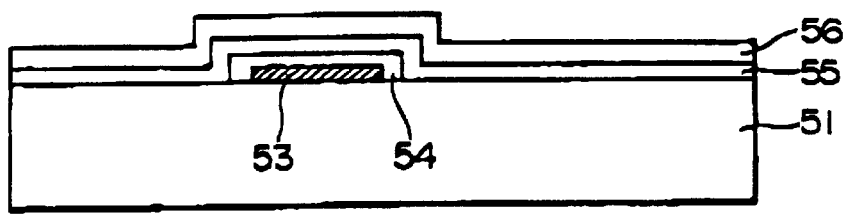
Figure 7G:
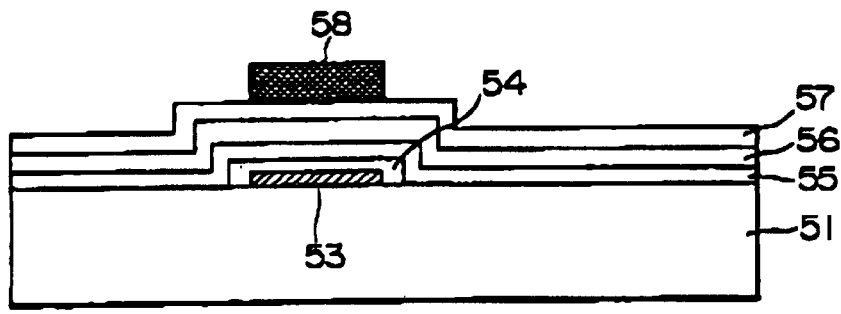
Figure 7H:
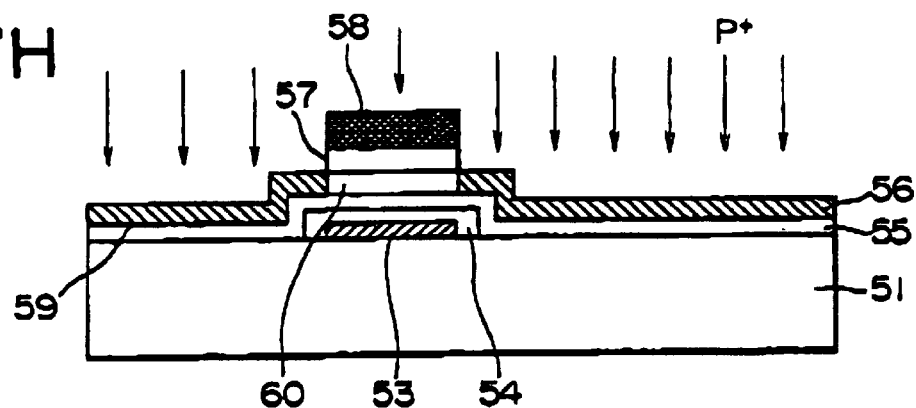
Figure 7I:
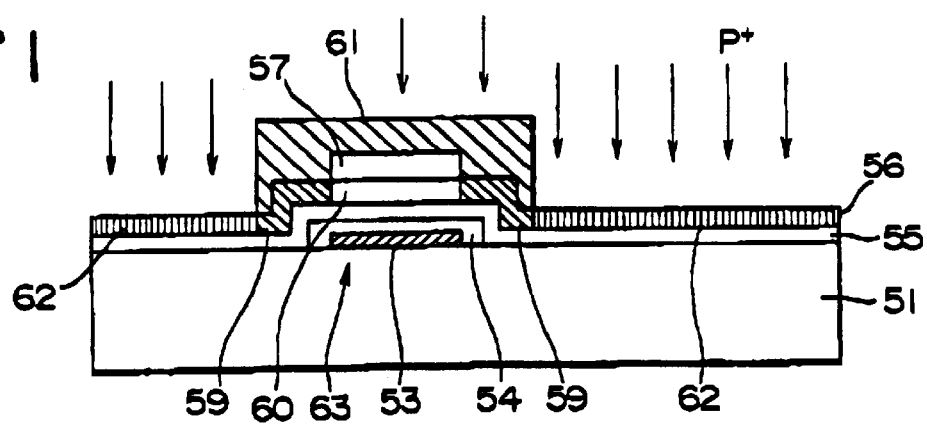

In a step of FIG. 7F, a gate insulating film 55 and a semiconducting thin film 56 are continuously formed by plasma CVD. In this method, the gate insulating film 55 has a double layer structure of $SiN/SiO_2$, and the semiconducting thin film 56 is made from amorphous silicon. Subsequently, ions of Si, SiF, F or the like are injected in the semiconducting thin film 56 acceleratedly in the presence of an electric field by means of an ion doping apparatus. The semiconducting thin film 56 is then converted from amorphous into polycrystalline structure by irradiation of a laser beam. In a step of FIG. 7G, a $SiO_2$ film 57 is formed on the semiconducting film 56 by CVD, and is coated with a photoresist 58 theron. The photoresist 58 is then patterned by exposure from the back surface of the substrate using the gate electrode 53 as a mask. As shown in the figure, the pattern of the photoresist 58 is matched with the pattern of the gate electrode 53. In a step of FIG. 7H, the $SiO_2$ film 57 is etched using the patterned photoresist 58 as a mask. Then, ions of an impurity are injected in the polycrystallized semiconducting thin film 56 in a relatively low dose by ion doping using the patterned photoresist 58 and the $SiO_2$ film 57 as a mask, to form a lightly doped region 59. In this method, $PH_3$ is used as a source gas for ion doping, to form an $N^-$-type lightly doped region 59. The dose of the impurity is controlled to be less than $5 \times 10^{19}/cm^3$. In addition, a channel region 60 not injected with the impurity is left directly under the $SiO_2$ film 57. In a step of FIG. 7I, the photoresist 58 not required to be re-used is removed and a photoresist 61 having a pattern larger than the photoresist 58 is formed. Ions of an impurity are injected in the semiconducting thin film 56 in a high dose by ion doping using the photoresist 61 as a mask, to form a highly doped region 62. In this method, $PH_3$ is used as a source gas for ion doping, to form an $N^+$-type highly doped region 62. The dose of the impurity is controlled to be more than $5 \times 10^{19}/cm^3$. The highly doped region 62 forms a source and a drain of the n-channel type thin film transistor 63. In addition, the lightly doped region 59 covered with the photoresist 61 is left between the channel region 62 and the highly doped region 62 on each side of the channel region 60.

Figure 7J:
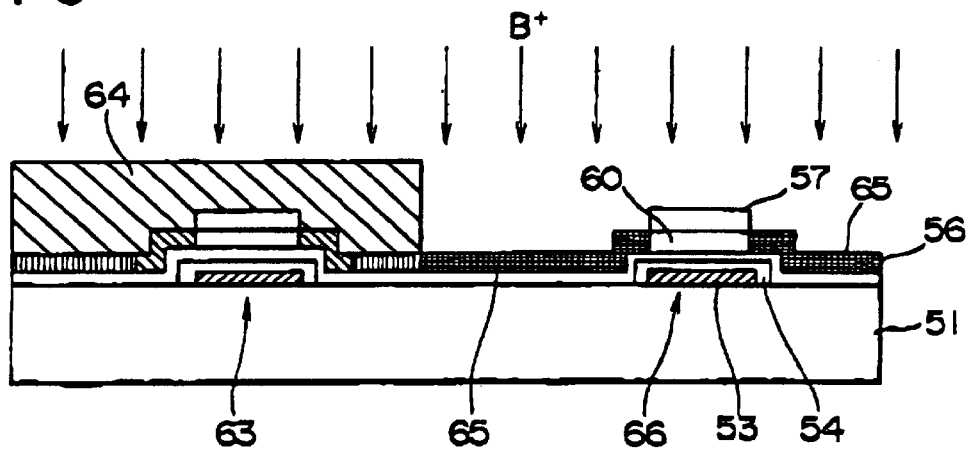
Figure 7K:
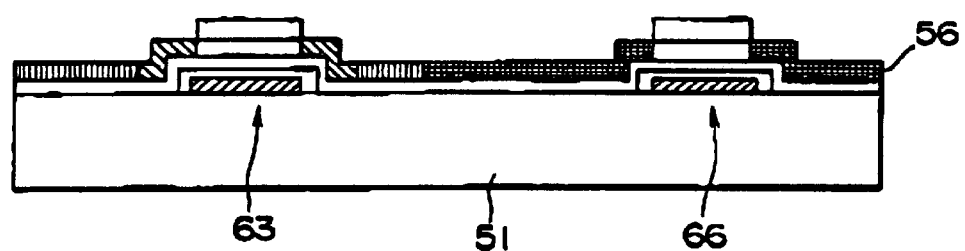
Figure 7L:
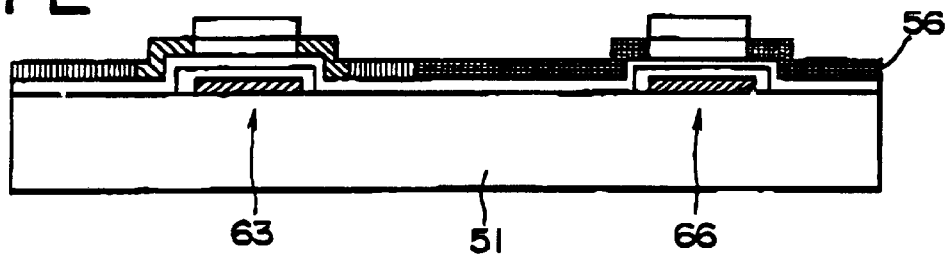
Figure 7M:
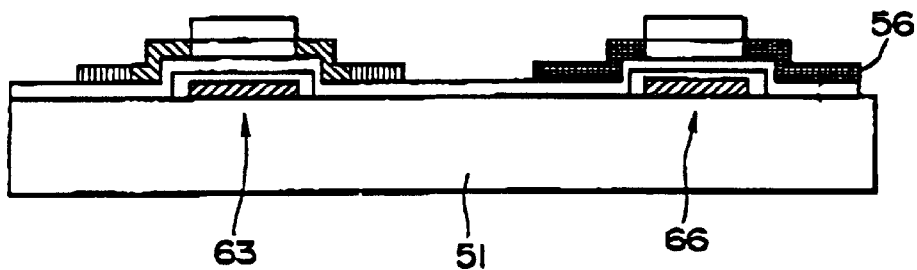

In a step of FIG. 7J, the n-channel type thin film transistor 63 is covered with a third photoresist 64. The other gate electrode 53, semiconducting thin film 56, $SiO_2$ film and the like are exposed at a portion not covered with the third photoresist 64. The channel region 60 not injected with any impurity is left directly under the $SiO_2$ film 57. In such a state, ions of a p-type impurity B are injected in the semiconducting thin film 56 in a high dose by ion doping, to form a $P^+$-type highly doped region 65. The highly doped region 65 forms a source and a drain of a p-channel type thin film transistor 66. In this method, $BF_3$ is used as a source gas for ion doping. In this way, a pair of the n-channel type thin film transistor 63 and the p-channel type thin film transistor 66 are formed on the insulating substrate 51. After that, in a step of FIG. 7K, the third photoresist 64 not required to be re-used is removed. In a step of FIG. 7L, the impurity injected in the semiconducting thin film 56 is activated by irradiation of a laser beam at an energy density of about from 200 mJ/cm² to 500 mJ/cm². In a step of FIG. 7M, the semiconducting thin film 56 is patterned into an island shape by wet etching using HF, to separate individual thin film transistors 63, 66 from each other.

Figure 7N:
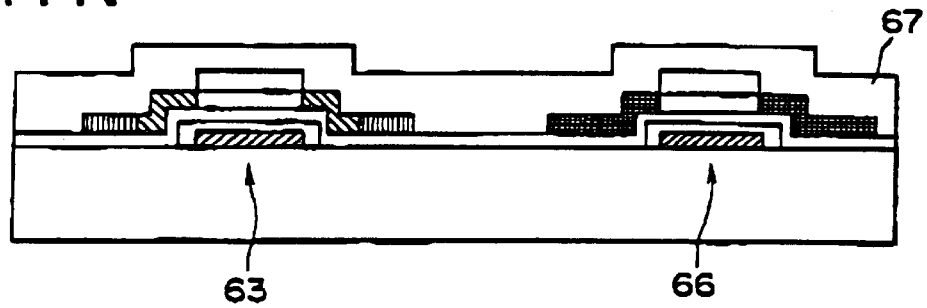
Figure 7O:
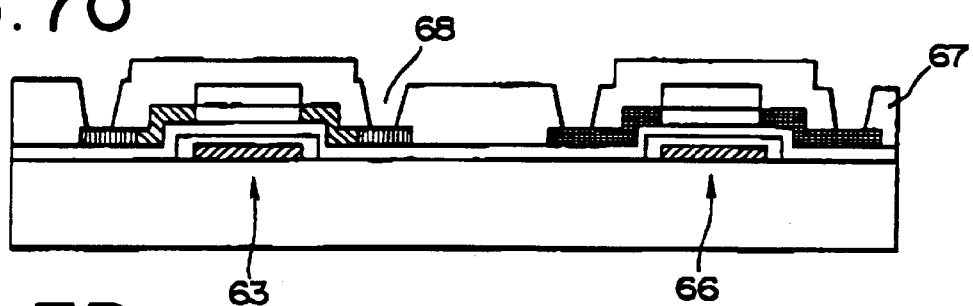
Figure 7P:
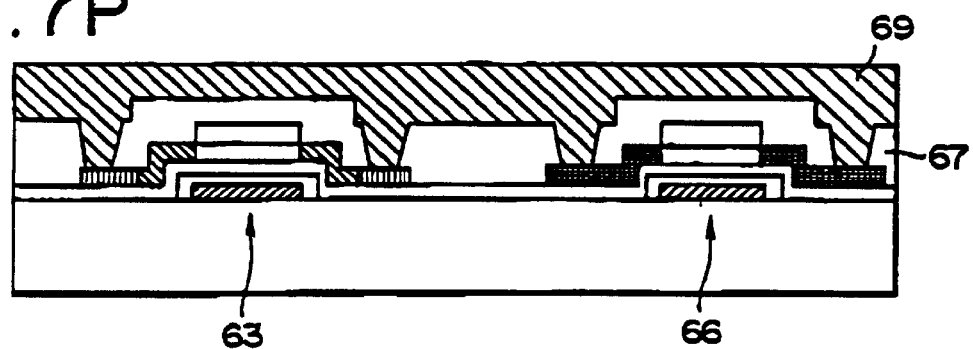
Figure 7Q:
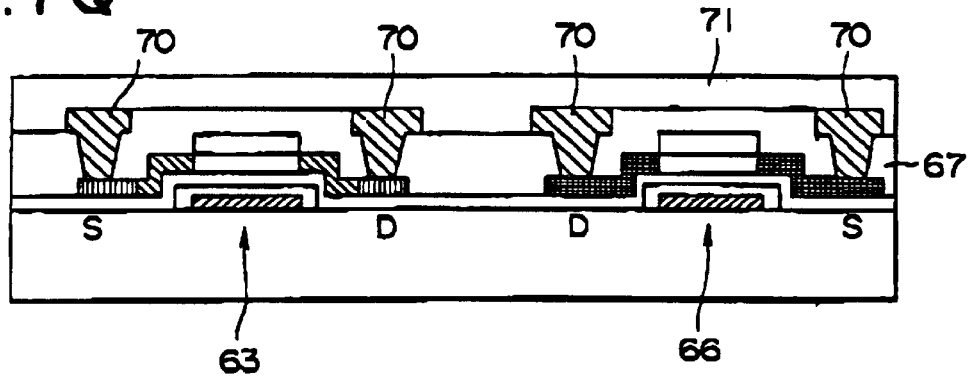
Figure 8:
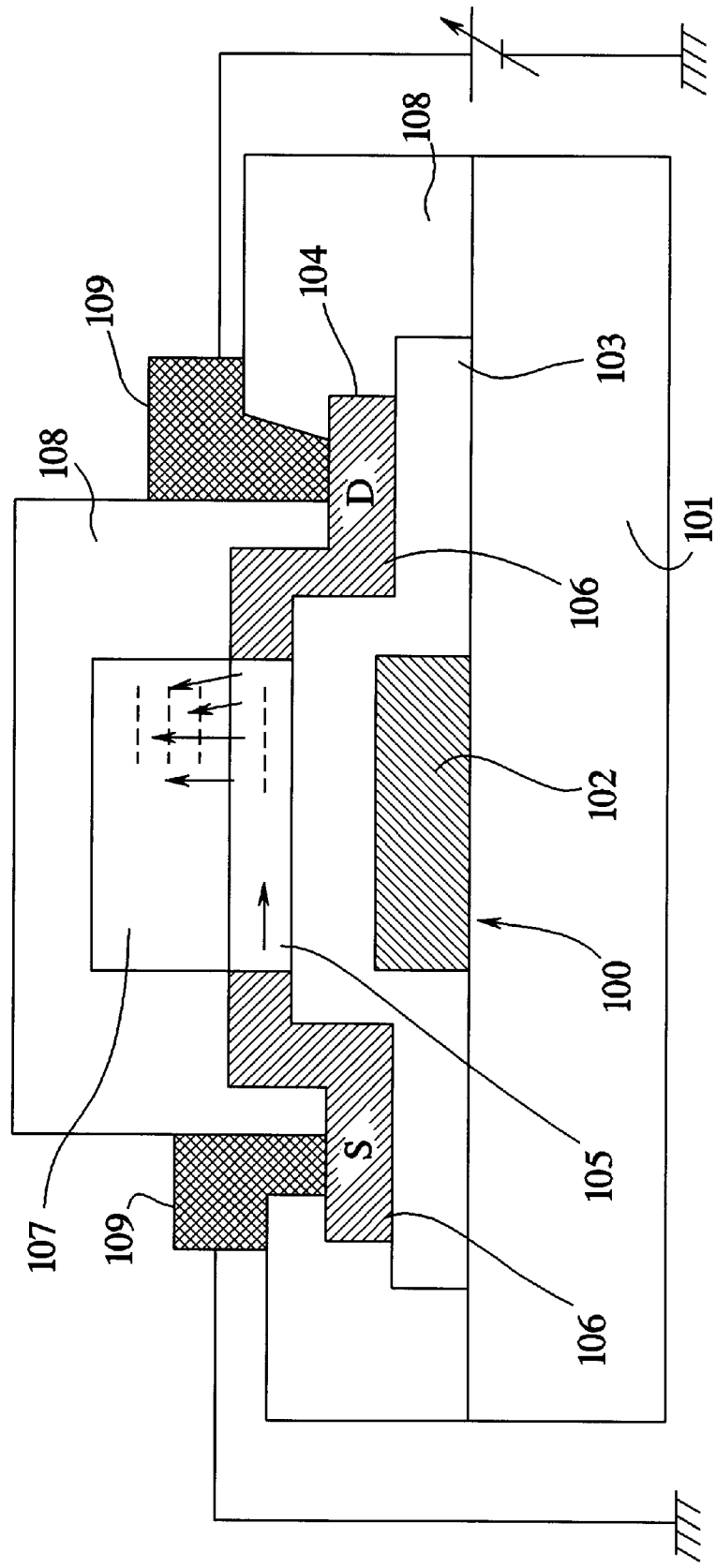
FIG. 8 is a sectional view of a related art semiconductor device.
Figure 9:
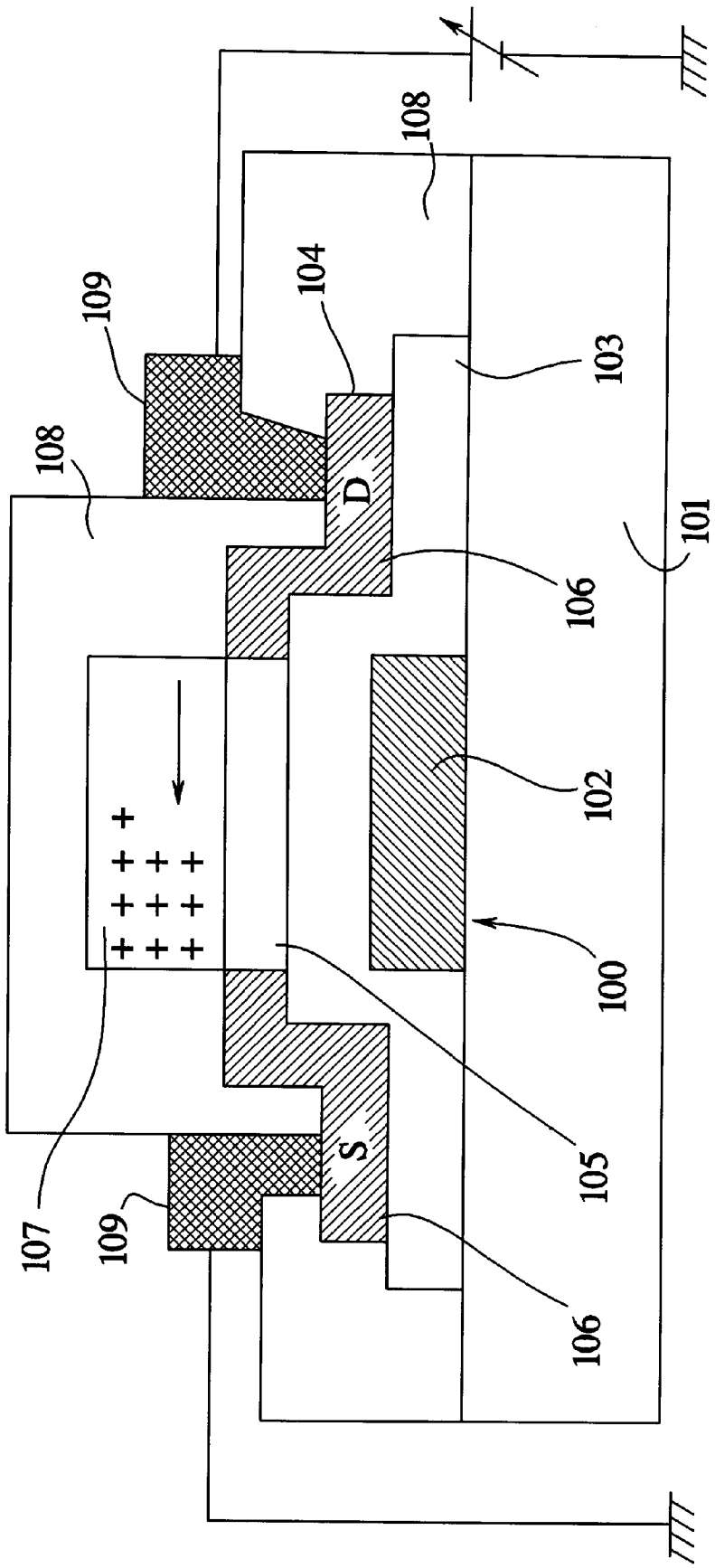
FIG. 9 is a sectional view of another related art semiconductor device.

In a step of FIG. 7N, a PSG (phosphosilicate glass) film is deposited by CVD, to provide an interlayer insulating film 67. In a step of FIG. 7O, the interlayer insulating film 67 is perforated by wet etching using HF, to form contact holes 68. In a step of FIG. 7P, an aluminum film 69 is deposited by sputtering. In a step of FIG. 7Q, the aluminum film 69 is patterned, to form interconnection electrodes 70. As can be seen from the figure, the patterned interconnection electrodes 70 are electrically connected to the sources S and the drains D of the thin film transistors 63, 66. Finally, the interconnection electrodes 70 are covered with a protective film 71.

While the preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
    an insulating substrate;
    a plurality of pixel electrodes arranged in a matrix on said insulating substrate;
    a matrix array comprised of a plurality of first thin film transistors for individually driving said pixel electrodes; and
    a peripheral driving circuit comprised of CMOS transistors formed on said insulating substrate for operating the matrix array;
    wherein each of said CMOS transistors includes a second thin film transistor comprising a gate electrode patterned on said insulating substrate; a gate insulating film covering said gate electrode; a semiconducting thin film comprised of polycrystalline silicon having highly-doped source/drain regions to form a channel region therebetween; and a lightly doped region at least between a drain side highly doped region and said channel region.

2. A semiconductor device according to claim 1, wherein said second thin film transistor has a lightly doped region between a source side highly doped region and said channel region.

3. A semiconductor device according to claim 1, wherein said first thin film transistors have a lightly doped region between said drain region and said channel region.

4. A semiconductor device according to claim 3, wherein said first thin film transistor has a lightly doped region between said source region and said channel region.

5. A semiconductor device according-to claim 1, wherein said polycrystalline silicon is a recrystallized silicon by irradiation of a laser beam.

6. A semiconductor device according to claim 1, wherein said lightly doped region formed between said drain side highly doped region and said channel region mitigates an electric field concentration at a drain edge and hence suppresses charges generated both in an interlayer insulating film and in said gate insulating film which are respectively brought in contact with upper and lower sides of said semiconducting thin film.

7. An electro-optical device comprising:
    a transistor array substrate comprising a first insulating substrate; a plurality of pixel electrodes arranged in a matrix on said first insulating substrate; a matrix array comprised of a plurality of first thin film transistors for individually driving said pixel electrodes; and a peripheral driving circuit comprised of CMOS transistors formed on said first insulating substrate; wherein each of said CMOS transistors includes a second thin film transistor comprising a gate electrode patterned on said first insulating substrate; a gate insulating film covering said gate electrode; a semiconducting thin film comprised of polycrystalline silicon having highly-doped source/drain regions to form a channel region therebetween; and a lightly doped region at least between a drain side highly doped region and said channel region;
    a counter substrate having a counter electrode, which is joined to said transistor array substrate with a specified gap held therebetween; and
    an electro-optical material held in said gap.

8. An electro-optical device according to claim 7, wherein said second thin film transistors have a lightly doped region between a source side highly doped region and said channel region.

9. An electro-optical device according to claim 7, wherein said first thin film transistor has a lightly doped region between said drain region and said channel region.

10. An electro-optical device according to claim 9, wherein said first thin film transistor has a lightly doped region between said source region and said channel region.

11. An electro-optical device according to claim 7, wherein said polycrystalline silicon is a recrystallized silicon by irradiation of a laser beam.

12. An electro-optical device according to claim 7, wherein said lightly doped region formed between said drain side highly doped region and said channel region mitigates an electric field concentration at a drain edge and hence suppresses charges generated both in an interlayer insulating film and in said gate insulating film which are respectively brought in contact with upper and lower sides of said semiconducting thin film.

* * * * *